(12) United States Patent
Broman et al.

(10) Patent No.: US 7,200,010 B2
(45) Date of Patent: Apr. 3, 2007

(54) IMPEDANCE QUALIZATION MODULE

(75) Inventors: Mark Hamilton Broman, Mankato, MN (US); Mike Howieson, Good Thunder, MN (US); Tsuguhiko Takamura, North Mankato, MN (US); Mark Brooks, Mankato, MN (US); Yasutsugu Okamoto, North Mankato, MN (US); Brent Huibregtse, Mankato, MN (US)

(73) Assignee: Thin Film Technology Corp., North Mankato, MN (US)

( * ) Notice: Subject to any disclaimer, the term of this patent is extended or adjusted under 35 U.S.C. 154(b) by 302 days.

(21) Appl. No.: 10/669,386

(22) Filed: Sep. 24, 2003

(65) Prior Publication Data

US 2004/0110421 A1 Jun. 10, 2004

Related U.S. Application Data

(63) Continuation-in-part of application No. 10/313,215, filed on Dec. 6, 2002, now Pat. No. 6,819,569.

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/765; 361/766
(58) Field of Classification Search ........ 361/765–766; 174/117 F; 333/12, 22 R
See application file for complete search history.

(56) References Cited

U.S. PATENT DOCUMENTS

| 4,153,885 | A | * | 5/1979 | Bacher .................. 333/28 R |
| 5,947,905 | A | * | 9/1999 | Hadjicostis et al. ........ 600/463 |
| 6,188,297 | B1 | * | 2/2001 | Akiba .................... 333/12 |

* cited by examiner

*Primary Examiner*—Tuan Dinh
(74) *Attorney, Agent, or Firm*—D L Tschida

(57) ABSTRACT

A thin film circuit module constructed for serial coupling to circuit conductors at printed and transmission line circuits. In one form of equalizer construction, thin film circuit elements are deposited on a supporting substrate and wherein a capacitor plate is defined a circuit resistor. Two connector applications serially couple the equalizer modules to trace conductors of a motherboard connector block and to cylindrical core conductors of a coaxial connector. Other hybrid equalizer constructions provide modules constructed of thin film resistors and pick-and-placed capacitors mounted piggyback to an equalizer module substrate.

8 Claims, 13 Drawing Sheets

IMPEDANCE QUALIZATION MODULE

This is a continuation-in-part of application Ser. No. 10/313,215 filed Dec. 6, 2002, now U.S. Pat. No. 6,819,569, issued Nov. 16, 2004.

BACKGROUND OF THE INVENTION

The present invention relates to passive thin film devices that compensate for signal losses over trace conductors at printed circuit assemblies and/or connectors and/or transmission lines and passively augment the impedance characteristic of the relevant conductive pathway, among other applications.

Dielectric and conductor losses, cross talk, reflections and noise, among a variety of other parasitic and signal degrading conditions, can impair operation of high frequency digital circuits, such as used in many telecommunication and networking applications. These problems are especially apparent at frequencies and data transfer rates in excess of 1.0 GHz, where reduced performance means reduced bandwidth and more hardware to achieve any desired result.

Cross talk can develop between signal lines and reflections and noise can develop from terminations. The resultant losses or signal attenuation, noise and cross talk can distort and reduce the fidelity of transmitted data signals. Delays can also occur with a resultant loss of synchronization in data conveyed between data supply conductors and responding circuitry. The degradation of signal fidelity and loss of synchronization make it difficult to distinguish the information content of transmitted data. High frequency circuit designers therefore expend considerable effort to minimize sources of noise, cross talk and signal attenuation.

Optical fiber, active repeater/amplifier devices and/or special materials can be used to improve signal integrity. Such devices, however, frequently require increased power and increased physical space for the circuitry. These improvements can also be relatively costly to implement.

Passive devices, such as capacitors or simple RC circuits, have been mounted to the top and bottom surfaces of printed circuit boards in close association to populated circuitry to enhance signal quality. Such mountings can be costly to implement and cannot be readily re-worked, if changes or fine-tuning is required. Embedded capacitors have also been incorporated into integrated circuit packages as shown at U.S. Pat. No. 6,407,929.

The subject invention provides thin film devices or equalization modules constructed of planar copper component features (e.g. passive resistors, capacitors, inductors) and/or hybrid components that, for example, can be coupled to printed circuit assemblies (e.g. mother and daughter boards) to offset losses present in signal carrying conductors. The equalization modules can be coupled to individual trace conductors of a printed circuit assembly to provide a tailored impedance characteristic to passively compensate for inherent high frequency signal degradation. The modules can also be mounted in connectors that couple to a printed circuit assembly to compensate for anticipated high frequency losses over a designed bandwidth at selected trace conductors at the pc board. Improved signal fidelity and synchronization are thereby achieved over an expanded operational bandwidth

SUMMARY OF THE INVENTION

It is a primary object of the present invention to provide a passive thin film device that can be coupled to compensate for signal attenuation and/or degradation occurring in conductors conveying signals at gigahertz frequencies.

It is a further object of the invention to provide a device that includes thin film capacitor(s) and resistor(s) deposited on a ceramic substrate and wherein a thin film capacitor plate separately defines a device resistor.

It is a further object of the invention to provide a connector to a printed circuit assembly and/or cable containing several equalizer devices.

It is a further object of the invention to provide a multi-port piggyback equalizer device that supports a pair of hybrid-mounted blocking capacitors and that mounts to conductor pathways of a printed circuit.

It is a further object of the invention to provide a coaxial cable connector including an equalizer device formed onto a cylindrical or tubular core piece.

Various of the foregoing objects, advantages and distinctions of the invention are found in a passive, thin film module having one or more input and output terminations to a shunt resistor/capacitor pair constructed on a ceramic substrate and wherein a thin film capacitor plate separately defines a device resistor. A printed circuit connector is also disclosed that includes several modules tailored to compensate for signal loss/degradation at the connector and a coupled circuit. That is, several of the foregoing equalizers of predetermined values are serially mounted to individual conductive paths or connector ports of a board/cable connector to compensate for anticipated trace conductor losses at a mating printed circuit assembly.

In another equalizer module configured on a ceramic substrate, a multi-port, hybrid thin-film, RC filter circuit module is disclosed that is used to improve the impedance characteristic of transmission lines and/or trace conductors.

In another equalizer module configured on a ceramic substrate, a multi-port, equalizer module supports a pair of blocking capacitors mounted piggyback to the substrate and which module mounts to conductor pathways of a printed circuit. The module enhances pc board performance and accommodates industry standard component placement requirements.

Yet another equalizer module is configured into a coaxial cable connector. The equalizer device is plated onto a cylindrical or tubular core piece that is fitted to one or more conventional connectors.

Still other objects, advantages and distinctions of the invention will become more apparent from the following description with respect to the appended drawings. Considered alternative constructions, improvements or modifications are described as appropriate. The description should not be literally construed in limitation of the invention. Rather, the scope of the invention should be broadly interpreted within the scope of the further appended claims.

BRIEF DESCRIPTION OF THE DRAWINGS

Similar reference numerals and characters at the drawings refer to like structure at the various drawings and which are as follows.

DESCRIPTION OF THE PREFERRED EMBODIMENT

Referring to FIGS. 1–4, views are shown to a passive thin film equalizer device 2. The device 2 can be coupled to conductors conveying signals at frequencies in excess of 1.0 GHZ to reduce conductor losses and improve signal integrity. The device 2 is typically constructed to condition a specific length of conductor. Longer conductors can be conditioned with several displace, serially arranged devices.

Figure 1:
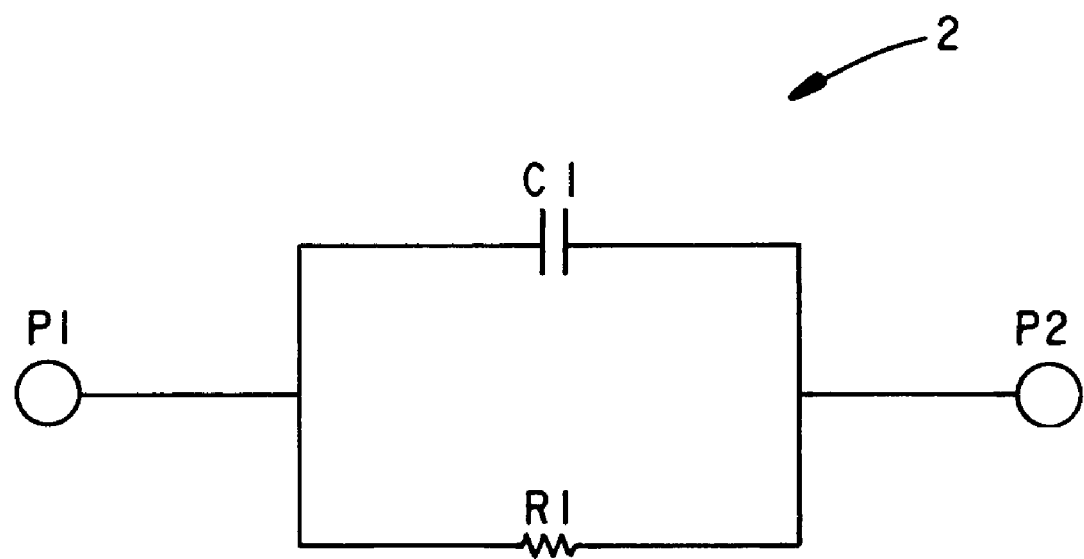
FIG. 1 shows a circuit schematic of an equalizer module that can be coupled to compensate for a lossy signal conductor (e.g. printed circuit trace, transmission line).

With attention to FIG. 1, the device 2 includes a capacitor element C1 and resistor element R1 that are coupled in parallel relative to input and output ports P1 and P2. The device 2 is typically coupled in series with a conductive path that is being conditioned, for example a printed circuit trace conductor or transmission line. The ports P1 and P2 can be coupled at any convenient location along the conductive path, including printed circuit terminations, such as in associated connectors.

Depending upon the length of the lossy conductor, the values of R1 and C1 can be sized as desired to provide a suitable equalization. Presently preferred devices 2 respectively provide component values for R1 in the range of 10 to 250 ohms and a C1 in the range of 0.5 to 10 picofarads (pf) with a respective dielectric thickness of 1 to 3 microns. Some presently preferred modules 2 provide respective R1 values of 10, 25 and 35 ohms, C1 values of 3, 5 and 8 pf and a ceramic dielectric thickness of 2.95, 1.77 and 1.105 μm. The circuit components can be constructed from a variety of compatible organic or inorganic substrate materials, including engineering grade polymers such as liquid crystal molding compounds (e.g. Ticona E530i).

Figure 2:
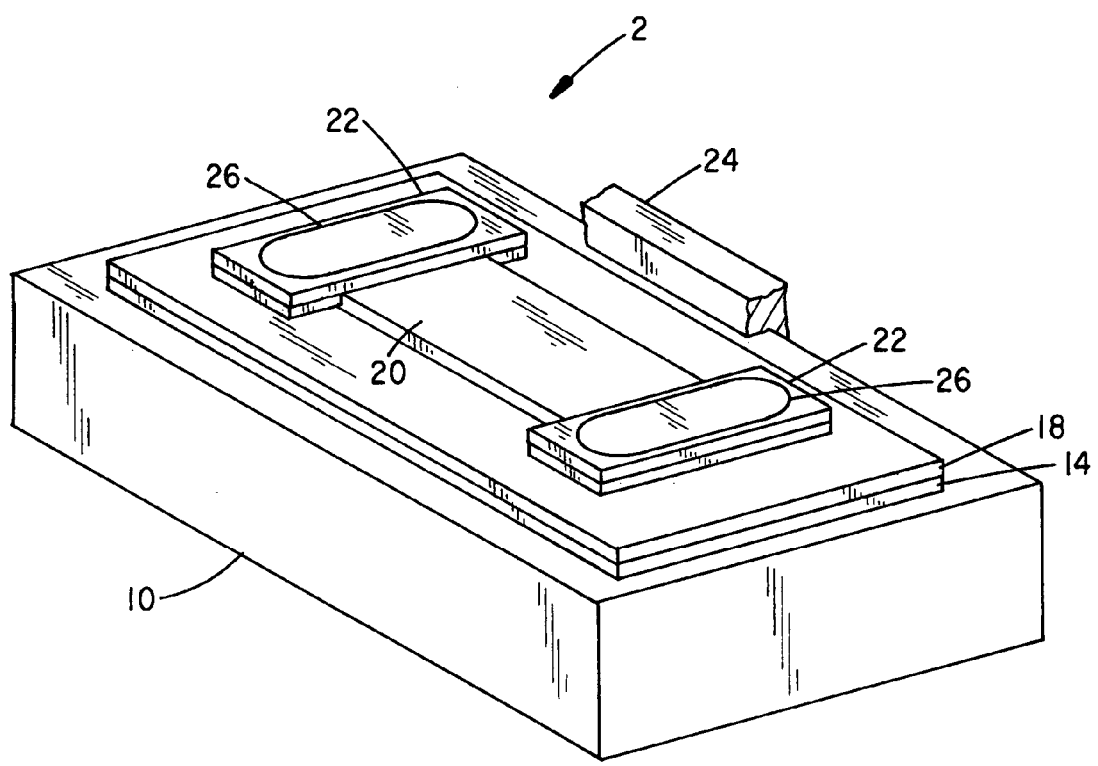
FIG. 2 is a perspective view of a thin film equalization module exhibiting the circuit of FIG. 1, prior to packaging.
Figure 3:
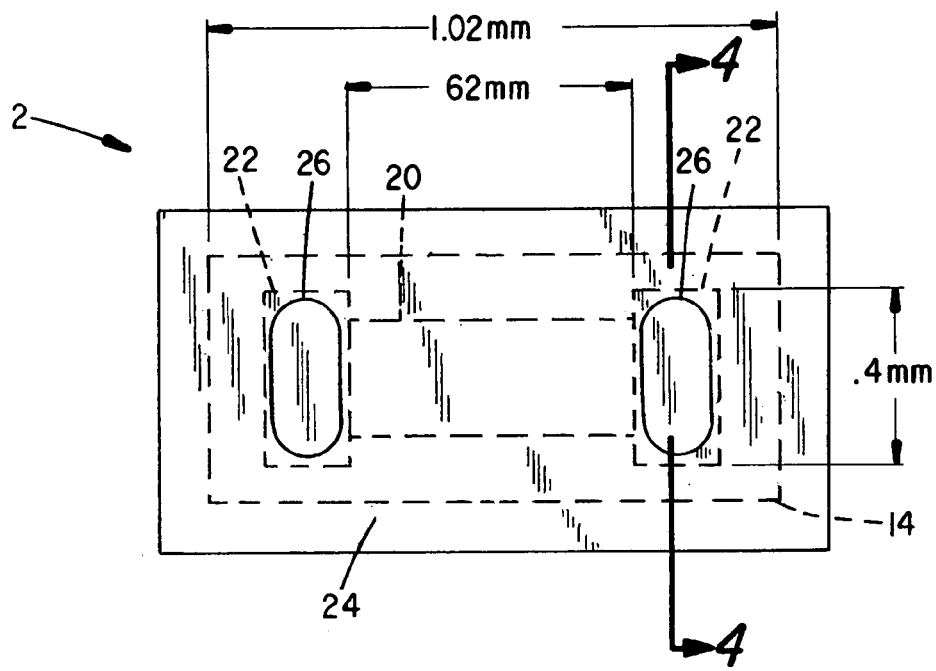
FIG. 3 is a top plan view of the equalization module of FIG. 2.
Figure 4:
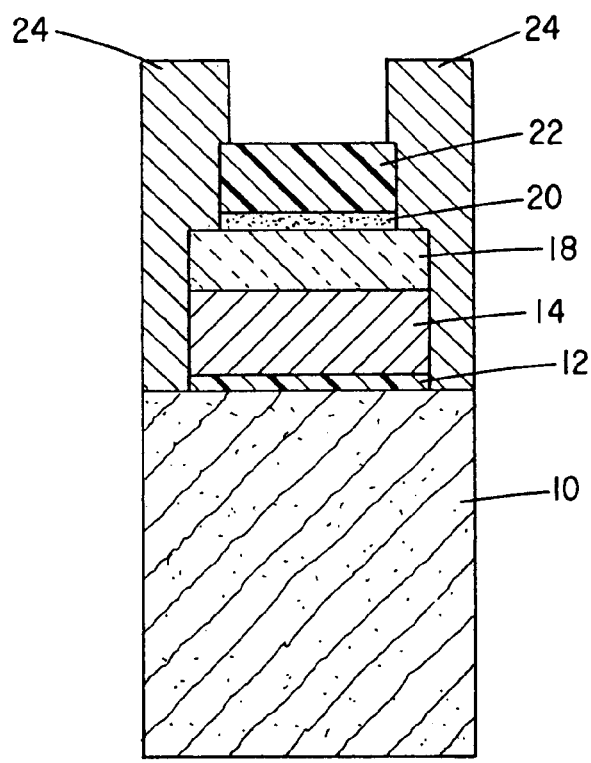
FIG. 4 is a cross section view taken along sections lines 4—4 through the equalization module of FIG. 2.

FIG. 2 depicts a perspective view of the unassembled device 2. FIGS. 3 and 4 depict a top plan view and a cross section view taken along section lines 4—4 of FIG. 3. With particular attention to FIG. 4, the device 2 is presently constructed on a ceramic substrate 10.

A NiCr adhesion layer 12 is first deposited over an aluminum oxide substrate 10. A layer of copper 14 is deposited over the adhesion layer 12. The layers 12 and 14 are chemically etched to desired shapes. The layer 14 defines the bottom plate of the capacitor C1. A suitable dielectric layer 18, e.g. tantalum oxide, silicon dioxide, or silicon nitride, is next deposited over the layer 14 and plasma etched to size and shape.

A NiCr resistive layer 20 is next deposited over the dielectric layer 18 and which layer 20 serves as the resistor R1 and the upper plate of the capacitor C1. The resistance value of R1 can be adjusted by changing the material resistivity, thickness and geometry of the layer 20 by chemical etching or other appropriate techniques. The NiCr layer 20 is presently constructed from 80-ohms/square or 160-ohms/square material and the length and the width of the layer 20 are 0.62 mm (length)×0.285 mm or 0.400 mm (width).

A copper layer 22 is next deposited over selected regions of the NiCr layer 20. The layer 22 is etched into two separated regions that are separated 62 mm and where termination contacts are to be formed. The copper regions 22 facilitate the bonding of solder and other materials used to form device terminations. The regions of the copper layer 22 also form portions of the upper capacitor plate along with the NiCr resistive layer 20, which principally defines the top capacitor plate.

A passivation layer 24 is next photo lithographically applied over the entire layered assembly to physically and electronically protect the device 2. Openings 26 are developed out after the exposure and which openings 26 are available to form the electrical termination pads P1 and P2. Conductive epoxy or other electrical connection materials (e.g. tin/lead solder or gold) can be filled or plated into the openings 26. The terminations can be constructed in conventional fashion to achieve any desired type of mounting required for any particular application.

Figure 5B:
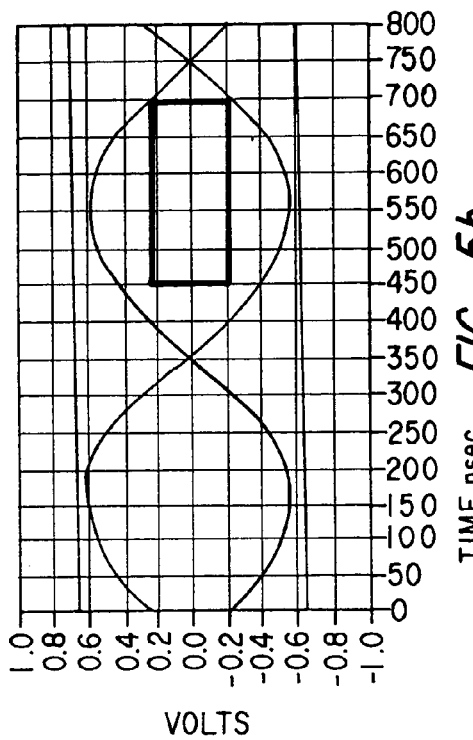
FIG. 5b shows the improvement in signal transmissions for the trace conductor simulated in FIG. 5a after being serially coupled to an equalizer module of the type shown in FIGS. 1–4.
Figure 5A:
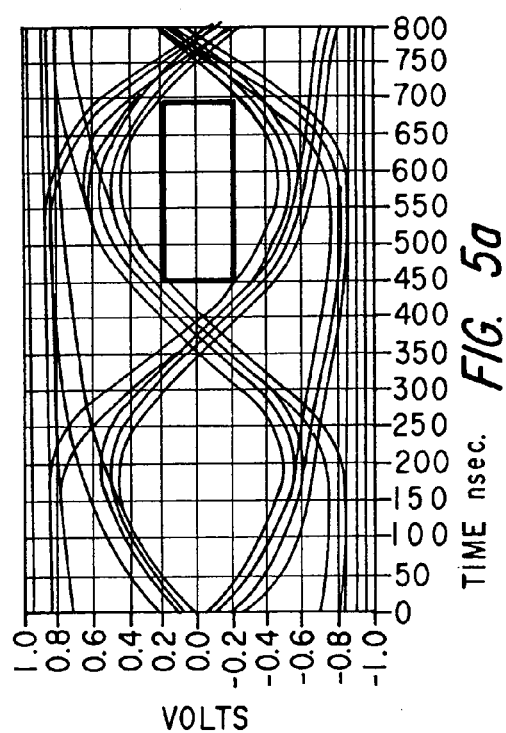
FIG. 5a shows a simulated signal waveform for a 20-inch length of trace conductor subjected to a 2.5 Gbit/sec pseudorandom data stream relative to an industry-defined window.

With attention next directed to FIGS. 5a, 5b and 6a, 6b, computer simulated waveforms developed upon coupling pseudorandom data streams or test signals at gigahertz frequencies are shown. FIGS. 5a and 5b depict before and after "eye" waveforms that were developed in relation to a simulated 20-inch back panel trace conductor simulated to standard industry specifications and subjected to a 2.5 gigabit per second (Gb/s), pseudorandom data stream. The rectangular box exemplifies a minimal, industry standard signal separation that must be maintained to detect "1's" and "0's". Losses and jitter that develops in the signals as they pass through the conductor are apparent at FIG. 5a from the differing high/low and time-shifted transitions.

FIG. 5b depicts an "eye" pattern developed for the same simulated trace conductor but including a suitable serially coupled equalizer 2. The substantially reduced variation in signal transitions provides a relatively well-defined "eye" pattern. The additional space between the box and the signals at the "0 db" cross over line infers that the trace conductor/equalizer combination is capable conducting higher frequency signals through the trace conductor before the signals will again degrade below accepted industry standards.

Figure 6B:
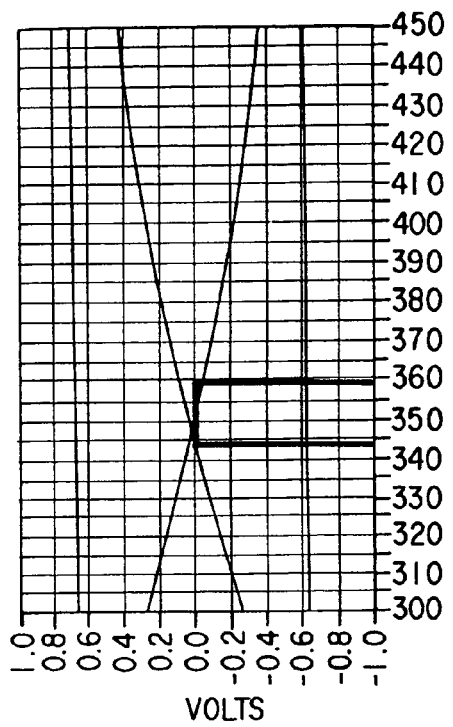
FIG. 6b shows the improvement in signal transmissions for the trace conductor simulated in FIG. 6a after being serially coupled to an equalizer module of the type shown in FIGS. 1–4.
Figure 6A:
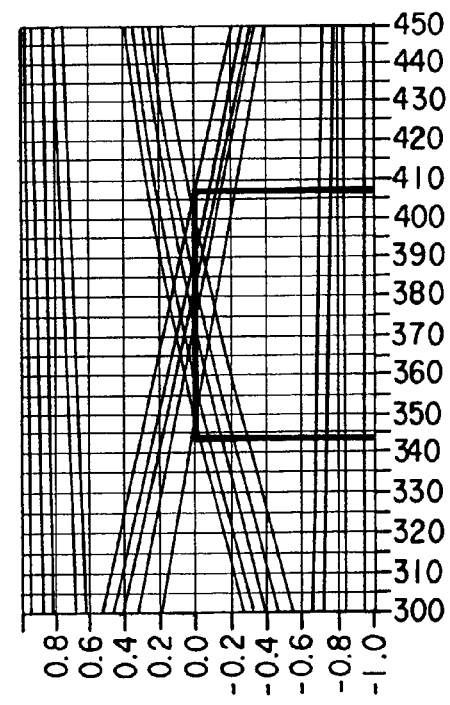
FIG. 6a shows a detailed view of the signal crossover point for a simulated 20-inch length of trace conductor subjected to a 2.5 Gbit/sec pseudorandom bit stream relative to an industry-defined window.

FIGS. 6a and 6b depict detailed views of the signal crossover point and the relative jitter (i.e. time shifting) on a horizontal time scale in relation to exemplary rectangular boxes for other representative industry standards. The FIG. 6a and 6b waveforms were developed for the same simulated 20-inch trace conductor and equalizer 2. The improved, relatively narrowed reference box at FIG. 6b again demonstrates that higher frequencies can be applied to the equalized trace conductor before signal degradation would overcome the signal conditioning obtained with the equalizer device 2.

Figure 7:
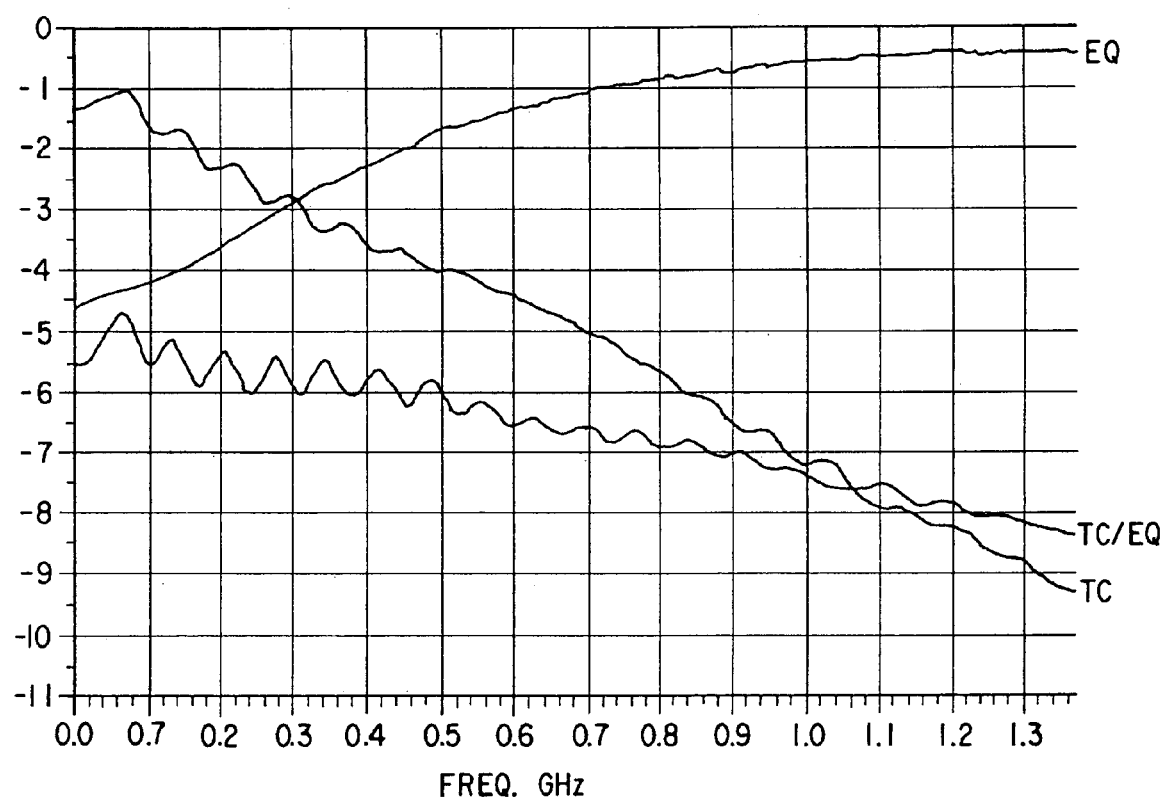
FIG. 7 shows actual measured loss waveforms for a sample 20-inch trace conductor (TC), an equalizer module (EM) and the trace conductor when serially coupled to the equalizer module (TC/EM).

FIG. 7 depicts actually measured loss data for an equalizer device 2 wherein R1=45 ohm and C1=10 pf and a 20-inch length of industry standard trace conductor. Measurements were taken over a frequency range up to 14 GHz. The "TC" waveform exhibits the measured loss for the trace conductor alone. The "EQ" waveform exhibits the measured loss for the equalizer module 2 alone. And the "TC/EQ" waveform exhibits the measured loss for the combination of the trace conductor and equalizer. The "TC/EQ" waveform demonstrates the substantially improved frequency stability of the equalizer conditioned trace conductor and confirms the improvements simulated at FIGS. 5a, 5b and 6a, 6b.

Figure 8:
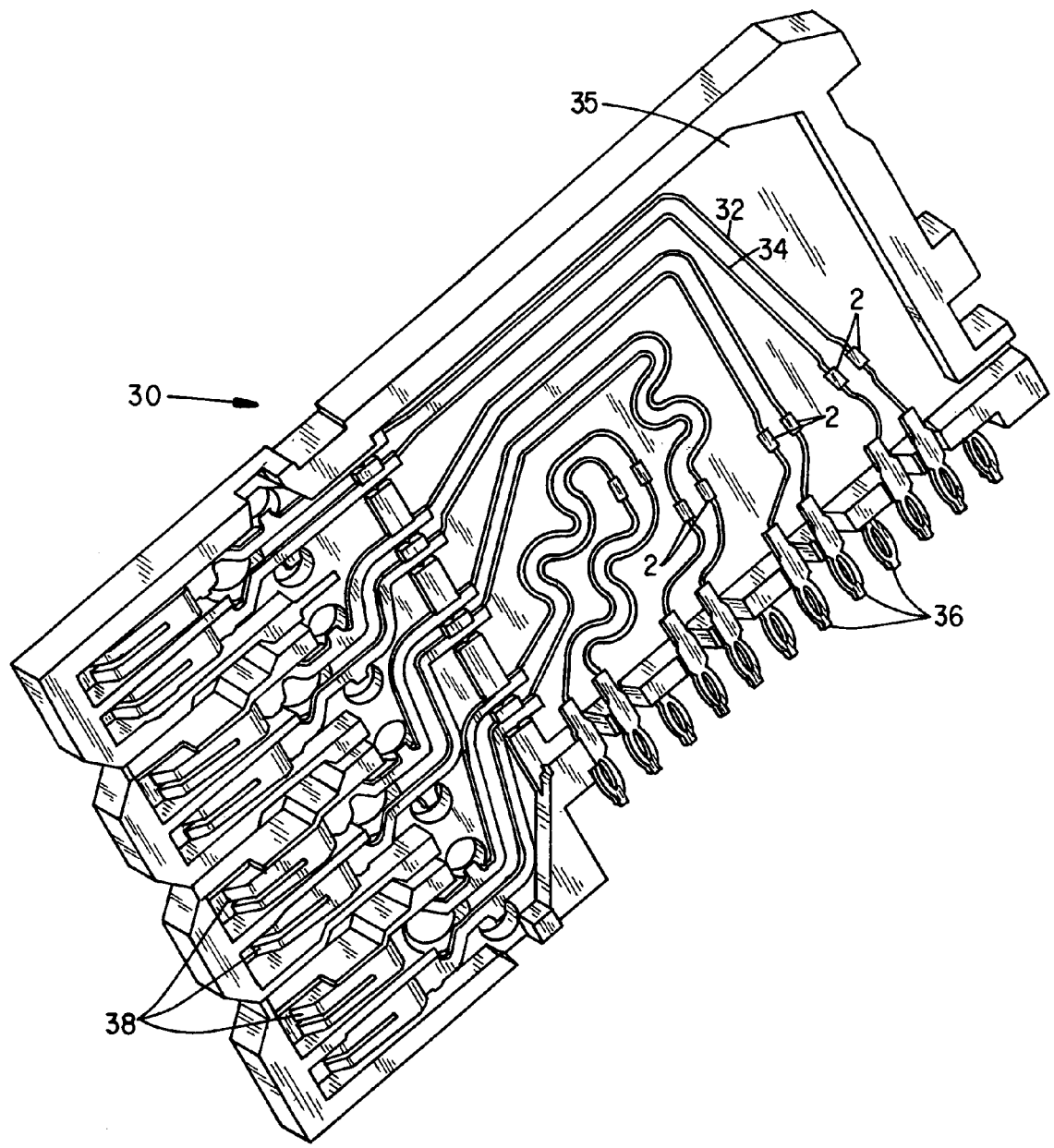
FIG. 8 shows a differential, back panel trace pair connector outfitted with a number of equalizers mounted to internal trace conductors.

FIG. 8 depicts one plate assembly 30 that attaches to a number of other plates and a cable for a back panel connector block. The plate assembly 30 includes a number of differential trace conductors 32 and 34 that extend between termination pins 36 and 38. The conductors 32 and 34 are formed on an appropriate insulative substrate 35 (e.g. epoxy pc board). Serially mounted in surface mount packages at gaps in the conductor traces 32 and 34 are a number of equalizer devices 2. The RC values of the devices 2 are judiciously selected to be compatible with differing lengths of trace conductors (not shown) at a "mother board" or "back panel" (not shown) and to which the pins 36 are affixed. The equalizers 2 are selected such that the back panel trace conductors are conditioned to pass the anticipated frequencies of the data signals. Line losses and synchronization differences (i.e. jitter) are thereby minimized over an expanded range of frequencies. Most significantly, the trace conductors are conditioned with a relatively inexpensive part in an economic fashion and without having to rework the motherboard or attempt to affix equalizer modules 2 to the board.

Figure 9:
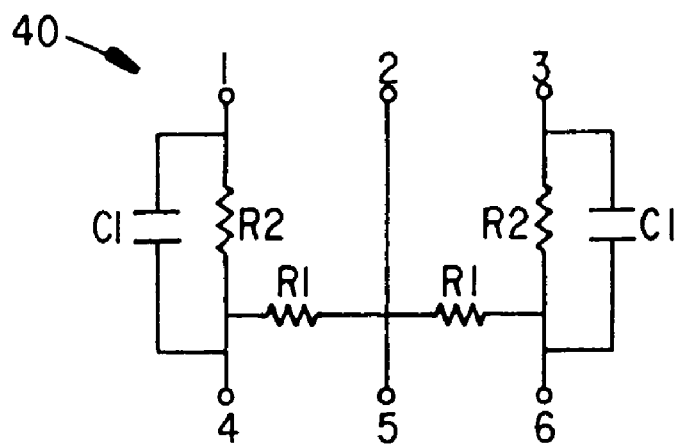
FIG. 9 shows a circuit schematic of a two-port hybrid thin-film equalizer module that can be coupled to a differential pair of signal conductors.
Figure 10:
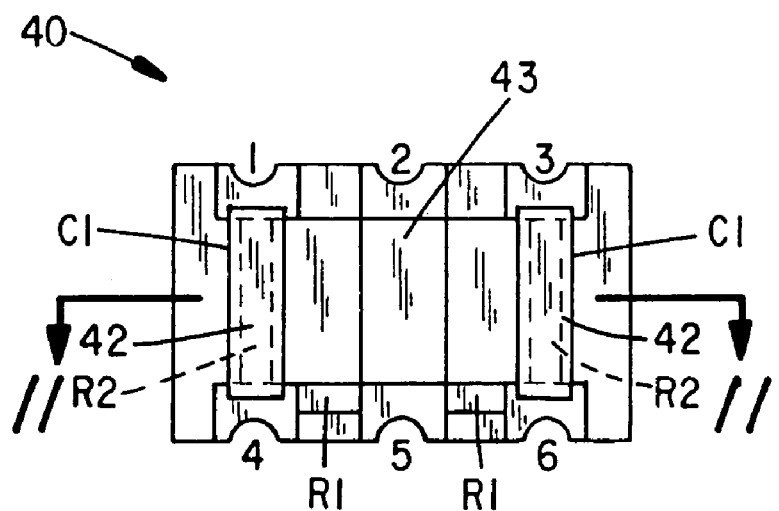
FIG. 10 shows a top plan view of the equalization module of FIG. 9 partially exposed to show the resistors R1 and R2 relative to the capacitors C1 and terminations 1–6.
Figure 11:
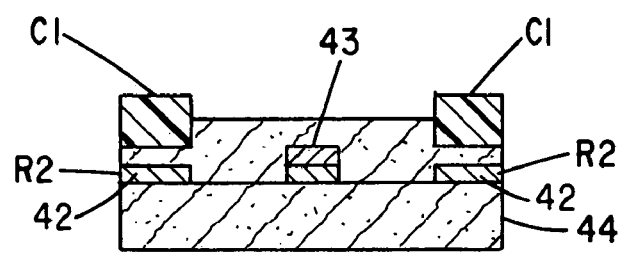
FIG. 11 shows a cross section view taken along sections lines 11—11 through the equalization module of FIG. 9.
Figure 12:
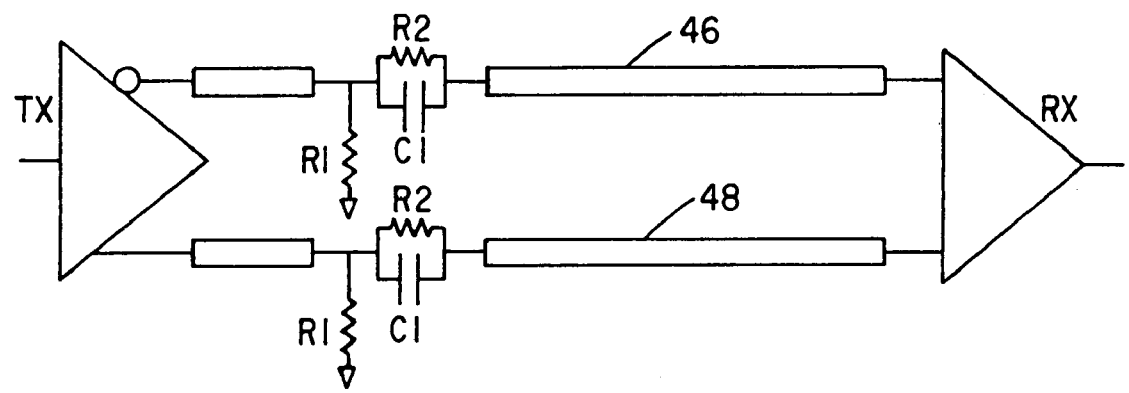
FIG. 12 depicts a schematic of a differential transmission line/transceiver application wherein the equalization module of FIG. 9 has been adapted.
Figure 13:
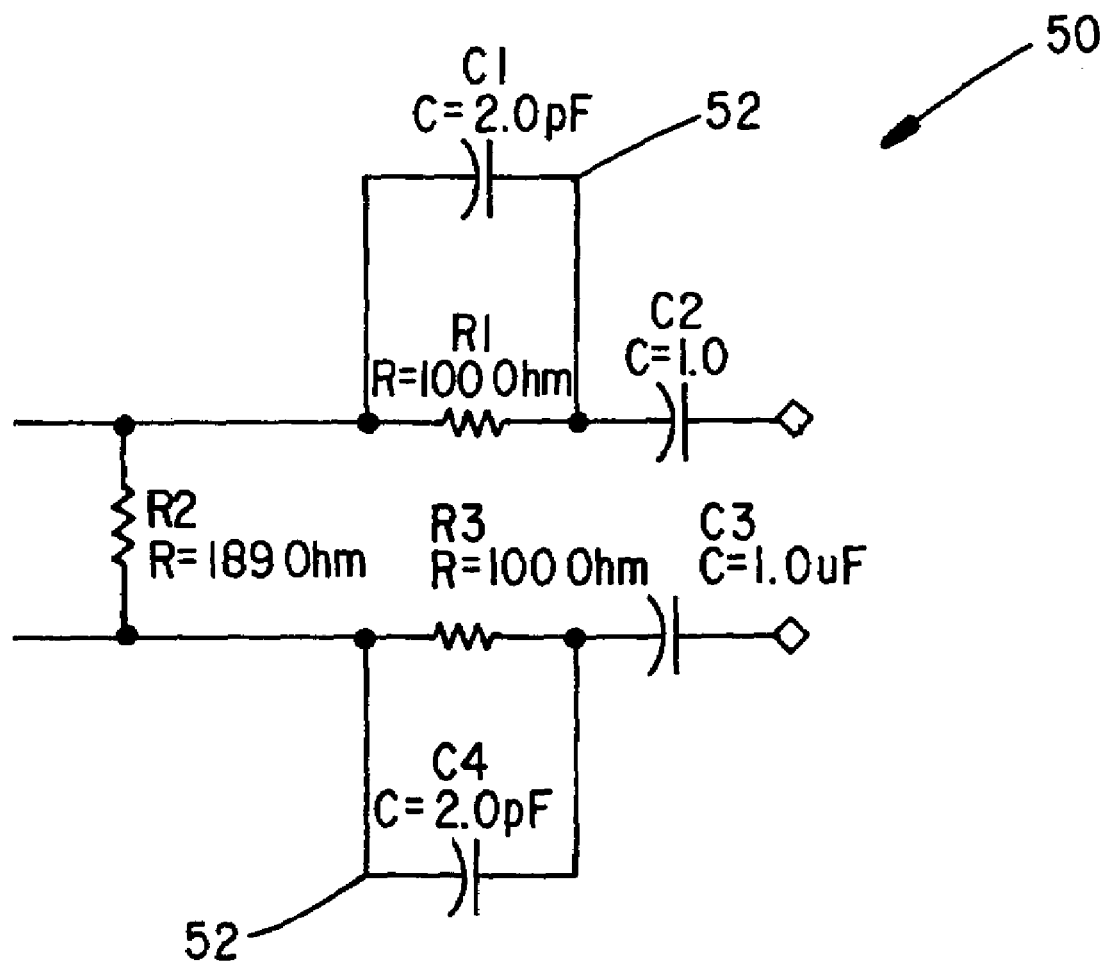
FIG. 13 shows a circuit schematic of a multi-port equalizer module that supports a pair of piggyback mounted blocking capacitors.

FIGS. 9, 10 and 11 disclose another construction of a two-port equalizer 40 that can be coupled to condition signals directed over differential cable transmission lines 46 and 48 shown at FIG. 12. The equalizer 40 is constructed in a thin-film hybrid configuration. That is and with attention to FIGS. 10 and 11, resistors R1 and R2 are defined by NiCr regions 42 that are photo lithographically processed from a thin-film layer of NiCr deposited on a substrate 44. Copper terminations 1–6 and a bus 43 are formed from a subsequently deposited and photo lithographically processed conductive layer (e.g. copper). Separately constructed capacitors C1 are bonded to the to the terminations 1, 3, 4 and 6. The assembly 44 is covered with an appropriate passivation material and appropriate terminals or pads are bonded or formed over the terminations 1–6 to accommodate an intended packaging or mounting, for example surface mount or edge mount.

In one presently typical construction, the components of the equalizer are constructed to exhibit values of R1=150 ohm, R2=25 ohm, and C1=30 pF. The equalizer 40 is thereby able to condition 3.25-inch lengths of the transmission lines 46 and 48 to pass signals up to 3.0 GHz.

FIGS. 13 through 16 depict another multi-port module 50 having two equalizers 52 formed on a single substrate and that are constructed in a fashion similar to that discussed above with respect to FIGS. 1–7. The module 50 provides a pair of equalizers 52 defined by parallel arrangements of resistors and capacitors R1,C1; R3,C4; and a bridge resistor R2. The resistors R1 and R2 exhibit nominal values of 100 ohm, R3—190 ohms and capacitors C1 and C4—2.0 pf. The resistors R1 also form one plate of each of the capacitors C1 and C4 and coextensively overly an intervening dielectric and an opposite plate.

Figure 14:
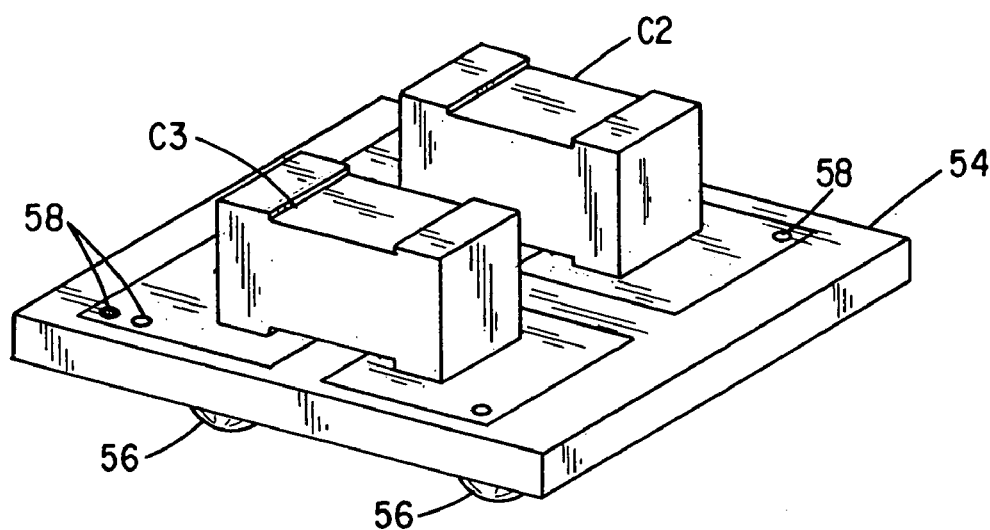
FIG. 14 is a perspective view of the equalizer module of FIG. 13.

Separately mounted to the supporting ceramic substrate 54 in piggyback fashion are blocking capacitors C2 and C3 (e.g. 1 µf), reference FIG. 14. Blocking capacitors are frequently mounted to printed circuit assemblies to filter undesired low-frequency noise. Normally, however, the individual equalizer modules 2 and blocking capacitors C2 and C3 are independently mounted on a pc assembly, which requires an industry defined amount of surface area beyond the actual footprint of each part to facilitate mounting with pick-and-place equipment. The mounting of the blocking capacitors C2 and C3 to the substrate 52 and subsequent mounting of the equalizer module 50 to the pc assembly conserves on the surface area required. The combined assembly 50 essentially occupies the same space as required by the blocking capacitors alone. It also does so without violating established industry spacing requirements for pick-and-placed components. The combined modules also enhance the performance characteristics of the pc assembly via circuit paths of reduced length.

Figure 15:
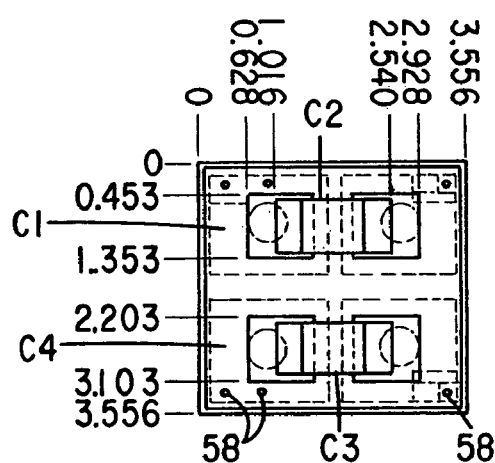
FIG. 15 shows a top plan view of the equalizer module of FIG. 13.
Figure 16:
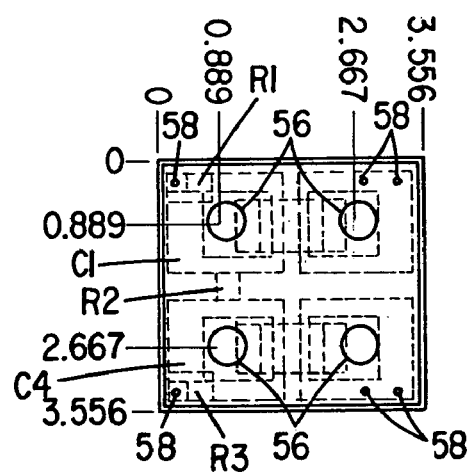
FIG. 16 shows a bottom plan view of the equalizer module of FIG. 13.

FIGS. 15 and 16 depict plan views of the piggyback assembly 50. The capacitors C2 and C3 are visible on one surface and surface solder terminations 56 (i.e. a ball grid array) are visible on the opposite surface of the substrate 54. The type of terminations can be varied to accommodate the mating pc board. The various conductive layers of each equalizer 52 are shown in dashed line and wherein NiCr layers that define the resistors R1 and R3 and one plate of the capacitors C1 and C4 overlie the opposite plate. Portions of the resistive layer separated from the capacitors C1 and C4 defines the bridge resistors R2. Appropriate circuit connections between the layers are effected with solder filled vias 58.

Figure 17:
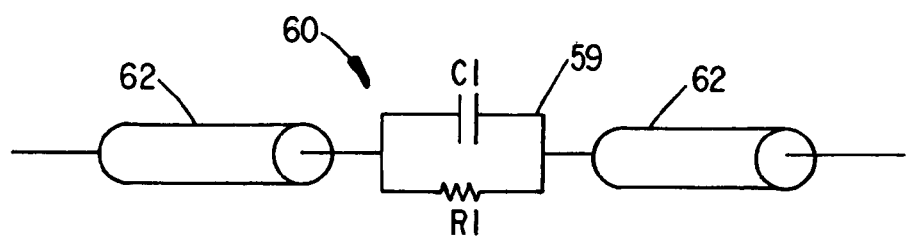
FIG. 17 shows a circuit schematic of a coaxial connector fitted with an equalizer module core.
Figure 18A:
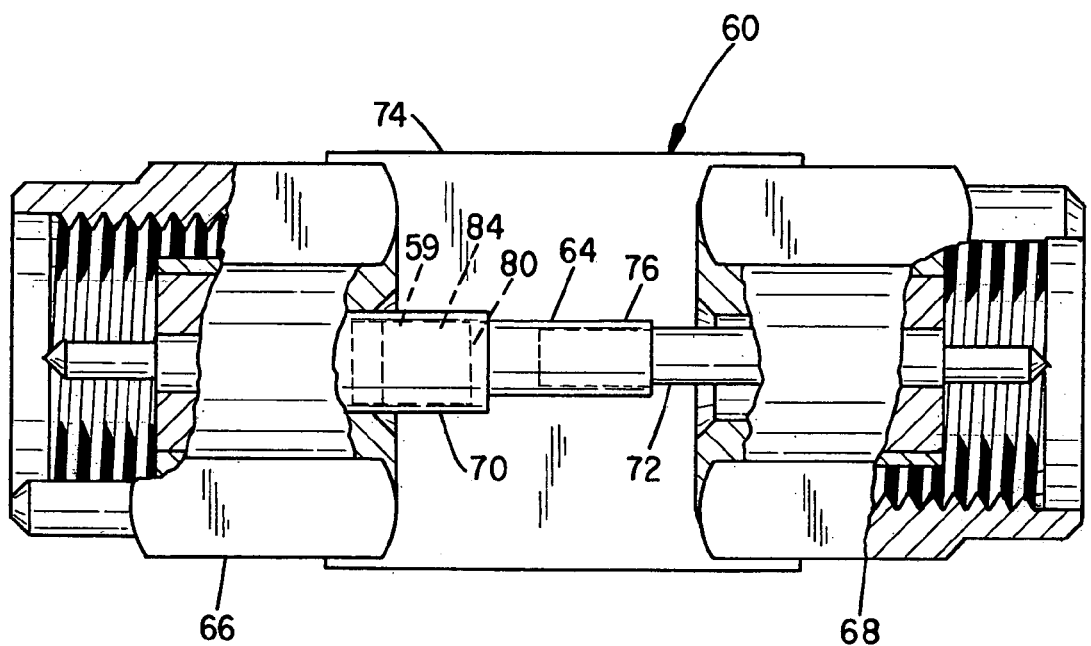
FIG. 18A shows a partial section view through a female/female coaxial connector fitted with an equalizer module core.
Figure 18B:
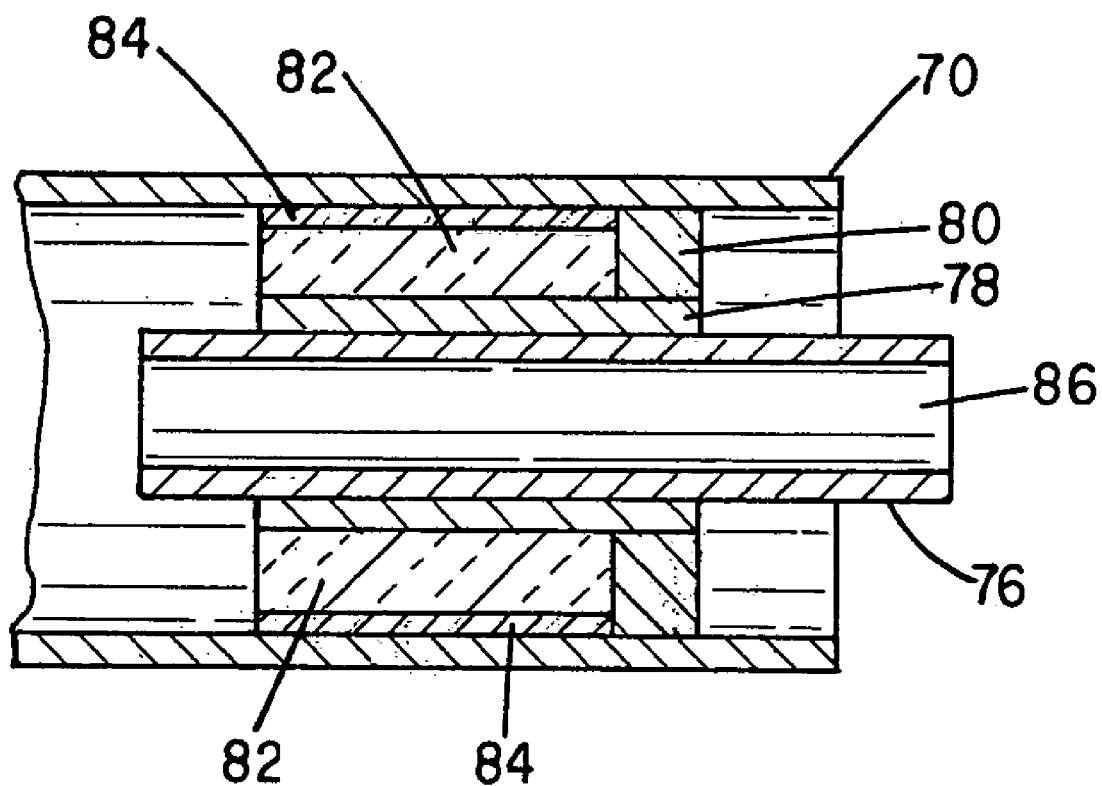
FIG. 18B shows a partial section view through the equalizer module core of FIG. 18A.

FIGS. 17, 18A, 18B and 19A–19H depict a coaxial, female/female cable connector 60 that has been adapted to include an equalizer 59. A generalized circuit schematic of the connector 60 relative to stub ends of mating coaxial conductors 62 is shown at FIG. 17. FIG. 18 depicts the connector 60 in partial cutaway and wherein the equalizer 59 is shown in dashed line and constructed as part of a core piece 64 that is fitted between two conventional female connector bodies 66 and 68 and there respective center conductors 70 and 72. A shielding sleeve 74 is fitted between the connector bodies 66 and 68 to encase the equalizer 59. It is to be appreciated the outer housing or body of the connector 60 can be constructed in a variety of connector configurations to be compatible with any desired circuit interconnection. The housing can also be specially constructed, other than using the depicted, conventional threaded female connectors 66 and 68.

FIGS. 19A–19H depict sequential assembly steps as the equalizer 59 is constructed onto a tubular or cylindrical core piece substrate 76 (e.g. a conductive metal). The core substrate 76 might also comprise a solid rod stock material. A layer 78 of NiCr or TaN, which defines the resistor R1, and an overlying copper band 80, which forms a series electrical connection to the substrate 76, are sequentially deposited onto the substrate 76 and layer 78 at 19B with an appropriate deposition process, such as by sputtering. The layers 78 and 80 are next appropriately photo etched.

A dielectric layer 82 (e.g. a suitable polymer or sputtered $SiO^2$) is next mounted or deposited over the layer 78 and etched at 19C. An optional copper layer 84 maybe overlaid onto the dielectric layer 82 and solder plated at 19D to form the opposite plate of the capacitor C1 to complete the equalizer circuit 59.

Figure 19A:
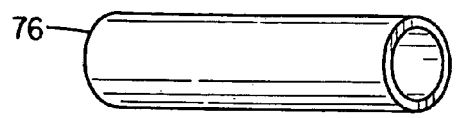
FIGS. 19A through 19H show process steps in the construction of the connector of FIG. 18A.
Figure 19B:
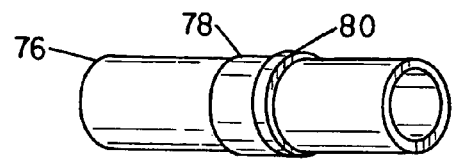
Figure 19C:
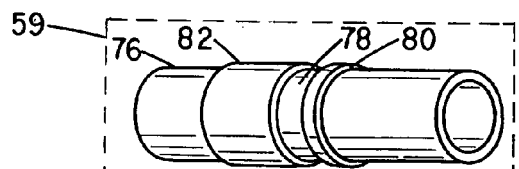
Figure 19D:
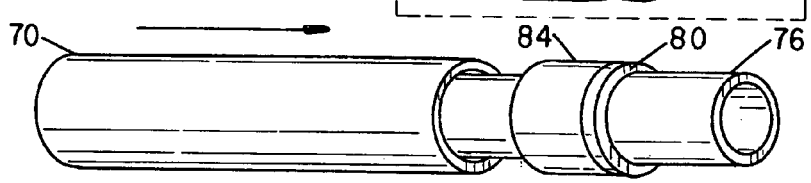
Figure 19E:
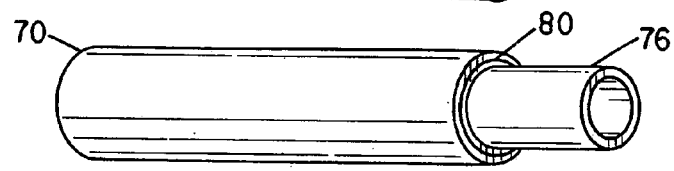
Figure 19F:
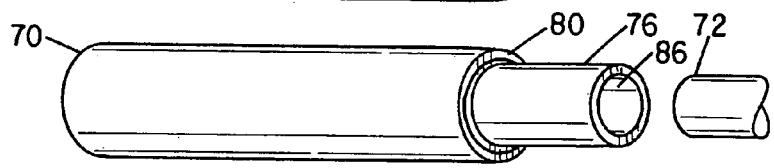
Figure 19G:
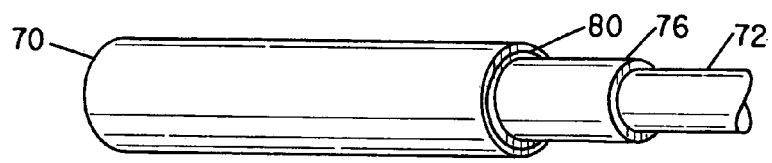
Figure 19H:
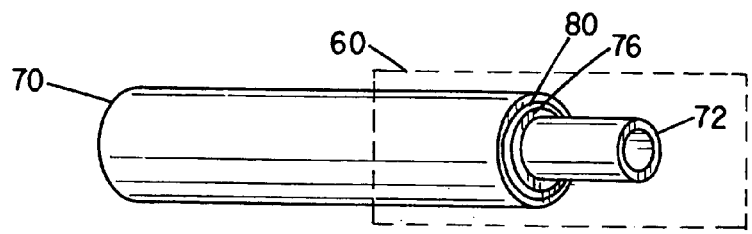

At FIG. 19E, the tubular equalizer 59 is next inserted into the bore of conductor 70 and the solder is re-flowed to secure the equalizer 2 to the conductor 70. The connector end 72 is then solder plated, inserted into the bore 86 of the substrate 76 and re-flowed at FIGS. 19F and 19G to secure the conductors 70 and 72 together. Lastly, the shield 60 is secured at 19H between the connector bodies 66 and 68 to mechanically protect and electrically shield the equalized connection.

Although the connector 60 is constructed of conventional connector bodies 66 and 68, the equalizer 59 can be formed onto one or more core piece(s) of any desired configuration. For example, the substrate 76 may be solid or tubular, may exhibit a variety of non-circular cross-sectional shapes, may couple to one or more adjoining pieces, and/or may include other conductive layers that define the conductive surfaces that mate with adjoining connectors.

In one alternative construction, the layers 78–84 might be formed onto a solid substrate that mounts with the housing of the connector 60 and has conductive end surfaces that mate with adjoining coaxial connectors, thereby avoiding several of the steps depicted at FIGS. 19D–19H. The substrate 76 may also include a variety of other passive circuit devices. Still other connector constructions containing the impedance conditioning circuitry of the invention can be developed for other applications.

While the invention has been described with respect to a presently preferred single termination module, it is to be appreciated still other constructions may be suggested to those skilled in the art. For example, each module can accommodate several equalization circuits. The type of termination of each module can be constructed to be compatible with a particular mounting. The circuit arrangement of the passive resistor and/or capacitor components of each module can also be organized differently. The modules can also be coupled to connectors at a cable end, directly to printed circuit assemblies or along the length of a cable, conductor or conductive trace. The circuits can also be formed to other non-planar substrates. The scope of the invention should therefore be construed broadly within the spirit and scope of the following claims.

What is claimed is:

1. A connector for high frequency signals comprising:
 a) a housing including input and output terminals coupled to at least one data pathway conducting data signals in excess of 1 gigahertz between said input and output terminals; and
 b) a passive thin film circuit serially coupled to said input and output terminals, wherein said thin film circuit includes a resistor and a capacitor arranged to exhibit a matching impedance characteristic to the data pathway, wherein said thin film circuit comprises an elongated hollow substrate, wherein first and second elongated annular layers are concentrically deposited onto said substrate defining first and second plates of said capacitors, wherein an elongated annular dielectric layer is deposited intermediate said first and second layers and wherein a portion of one of said first and second plates defines a resistor.

2. A connector as set forth in claim 1 wherein the one of said first and second plates that defines said resistor is formed of a material selected from a class of materials including tantalum oxide, silicon dioxide, silicon nitride, or nickel chrome.

3. A connector for high frequency signals comprising:
 a) a connector body having a housing adapted for interconnection with input and output conductors; and
 b) a core piece supported within said housing comprising a cylindrical substrate and a plurality of layers deposited over said substrate, wherein said layers include first and second elongated annular layers that define first and second plates of a capacitor, a dielectric layer sandwiched between said first and second conductive layers, wherein a portion of one of said first and second conductive layers also defines a resistor, and wherein an impedance characteristic of said core piece matches that of said input and output conductors.

4. A connector as set forth in claim 3 wherein said substrate is mounted to adjacent tubular conductors connected to said input and output conductors.

5. A connector as set forth in claim 3 wherein said core piece includes an annular band of conductive material that electrically couples to one of said input and output conductors.

6. A connector as set forth in claim 3 wherein said sudstrate is hollow and is mounted to adjacent conductors connected to said input and output conductors.

7. A connector for high frequency signal comprising:
 a) a coaxial connector body having a housing adapted for interconnection with input and output conductors; and
 b) an electrically conductive core piece supported within said housing and having a plurality of layers including a first cylindrical conductive layer defining a resistor and a first plate of a capacitor, a cylindrical dielectric layer overlying said first conductive layer, and a second cylindrical conductive layer overlying said dielectric layer and defining a second plate of said capacitor, and wherein said core piece exhibits an impedance characteristic that matches that of said input and output conductors, a and wherein said core piece comprises a hollow cylindrical conductive substrate containing said first and second conductive layers and said dielectric layer and wherein said core piece is concentrically mounted to adjacent conductors connected to said input and output conductors.

8. A connector as set forth in claim 7 wherein said core piece comprises a hollow tubular substrate.

* * * * *